US00RE47561E

(19) United States
(12) Reissued Patent
Yoshikawa et al.

(10) Patent Number: US RE47,561 E
(45) Date of Reissued Patent: Aug. 6, 2019

(54) MULTI CHARGED PARTICLE BEAM WRITING METHOD AND MULTI CHARGED PARTICLE BEAM WRITING APPARATUS

(71) Applicant: NUFLARE TECHNOLOGY, INC., Yokohama-shi (JP)

(72) Inventors: Ryoichi Yoshikawa, Kawasaki (JP); Munehiro Ogasawara, Hiratsuka (JP)

(73) Assignee: NuFlare Technology, Inc., Yokohama-shi (JP)

(21) Appl. No.: 15/150,081

(22) Filed: May 9, 2016

Related U.S. Patent Documents

Reissue of:
(64) Patent No.: 8,729,507
Issued: May 20, 2014
Appl. No.: 13/896,767
Filed: May 17, 2013

(30) Foreign Application Priority Data

Jun. 1, 2012 (JP) ..... 2012-126368

(51) Int. Cl.

| | |
|---|---|
| ***B82Y 10/00*** | (2011.01) |
| ***B82Y 40/00*** | (2011.01) |
| ***H01J 37/304*** | (2006.01) |
| ***H01L 21/30*** | (2006.01) |
| ***H01J 37/28*** | (2006.01) |
| ***H01J 37/317*** | (2006.01) |

(52) U.S. Cl.
CPC ..... *H01J 37/3177* (2013.01); *B82Y 10/00* (2013.01); *B82Y 40/00* (2013.01); *H01J 37/28* (2013.01); *H01J 37/3045* (2013.01); *H01J 2237/216* (2013.01); *H01L 21/30* (2013.01)

(58) Field of Classification Search
CPC .... H01J 37/3177; H01J 37/28; H01J 37/3045; H01L 21/30; B82Y 10/00
USPC ..... 250/492.1, 398, 492.2, 492.22
See application file for complete search history.

(56) References Cited

U.S. PATENT DOCUMENTS 2,848,648 A * 8/1958 Wolcott ..... 315/384
5,393,987 A 2/1995 Abboud et al.
(Continued)

FOREIGN PATENT DOCUMENTS

| | | |
|---|---|---|
| JP | 2006-261342 | 9/2006 |
| JP | 2013-55144 | 3/2013 |
| JP | 2013-55145 | 3/2013 |

*Primary Examiner* — Albert J Gagliardi
(74) *Attorney, Agent, or Firm* — Oblon, McClelland, Maier & Neustadt, L.L.P.

(57) ABSTRACT

A multi charged particle beam writing method includes calculating first shot positions of multiple beams, each of which includes a distortion amount of an irradiating corresponding beam, in a case of irradiating each beam, based on control grid intervals, calculating first condition positions based on a pre-set condition, each of which is arranged in a corresponding first region surrounded by closest second shot positions of 2×2 in length and width of the first shot positions, calculating, for each of second regions respectively surrounded by closest second condition positions of the first condition positions, an area density of a figure pattern in overlapping with a second region concerned, calculating an irradiation amount or an irradiation time of each beam whose corresponding first shot position is in a corresponding second region, based on an area density, and writing a pattern by irradiating a beam of the calculated irradiation amount or time.

18 Claims, 17 Drawing Sheets

(56) References Cited

U.S. PATENT DOCUMENTS

| | | | | |
|---|---|---|---|---|
| 6,028,317 | A * | 2/2000 | Murooka et al. | 250/492.23 |
| 6,855,929 | B2 * | 2/2005 | Kimba et al. | 850/9 |
| 6,870,171 | B2 | 3/2005 | Hosoda et al. | |
| 7,741,601 | B2 * | 6/2010 | Noji et al. | 250/310 |
| 7,781,748 | B2 * | 8/2010 | Platzgummer | 250/492.22 |
| 7,842,926 | B2 | 11/2010 | Olsson et al. | |
| 7,875,858 | B2 * | 1/2011 | Ito et al. | 250/396 ML |
| 8,183,544 | B2 * | 5/2012 | Tsuruta et al. | 250/492.22 |
| 9,607,806 | B2 * | 3/2017 | Zonnevylle | H01J 37/3177 |
| 2008/0078947 | A1 * | 4/2008 | Horiuchi | B82Y 10/00 250/492.2 |
| 2009/0008568 | A1 * | 1/2009 | Abe | B82Y 10/00 250/396 R |
| 2009/0014663 | A1 * | 1/2009 | Nishimura | B82Y 10/00 250/396 R |
| 2009/0173887 | A1 * | 7/2009 | Ito et al. | 250/396 ML |
| 2009/0200495 | A1 * | 8/2009 | Platzgummer | 250/492.22 |
| 2009/0242807 | A1 * | 10/2009 | Tsuruta et al. | 250/492.2 |
| 2010/0148087 | A1 * | 6/2010 | Doering | B82Y 10/00 250/396 R |
| 2011/0253912 | A1 * | 10/2011 | Matsumoto | 250/492.22 |
| 2013/0056645 | A1 | 3/2013 | Yoshikawa et al. | |
| 2013/0056647 | A1 | 3/2013 | Yoshikawa et al. | |
| 2013/0320230 | A1 * | 12/2013 | Yoshikawa et al. | 250/398 |

* cited by examiner

| | | | |
|---|---|---|---|
| ⋮ | ⋮ | ⋮ | ⋮ |
| ⋯ | $R(x_{n-1}, y_{n+1})$ | $R(x_n, y_{n+1})$ | ⋯ |
| ⋯ | $R(x_{n-1}, y_n)$ | $R(x_n, y_n)$ | ⋯ |
| ⋯ | $R(x_{n-1}, y_{n-1})$ | $R(x_n, y_{n-1})$ | ⋯ |
| ⋮ | ⋮ | ⋮ | ⋮ |

FIG. 10

| | | | | |
|---|---|---|---|---|
| ⋮ | ⋮ | ⋮ | ⋮ | ⋮ |
| ⋯ | $P(x_{n-1}, y_{n+1})$ | $P(x_n, y_{n+1})$ | $P(x_{n+1}, y_{n+1})$ | ⋯ |
| ⋯ | $P(x_{n-1}, y_n)$ | $P(x_n, y_n)$ | $P(x_{n+1}, y_n)$ | ⋯ |
| ⋯ | $P(x_{n-1}, y_{n-1})$ | $P(x_n, y_{n-1})$ | $P(x_{n+1}, y_{n-1})$ | ⋯ |
| ⋮ | ⋮ | ⋮ | ⋮ | ⋮ |

FIG. 12

54

50

| | | | | | | | |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 0 | 0 | 48 | 80 | 80 | 80 | 80 | 32 |
| 0 | 0 | 60 | 100 | 100 | 100 | 100 | 40 |
| 0 | 0 | 60 | 100 | 100 | 100 | 100 | 40 |
| 0 | 0 | 12 | 20 | 20 | 20 | 20 | 8 |
| 0 | 0 | 0 | 0 | 0 | 0 | 0 | 0 |
| 0 | 0 | 0 | 0 | 0 | 0 | 0 | 0 |

FIG. 14B

52

50

| | | | | | | | |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 0 | 0 | 44 | 77 | 74 | 76 | 75 | 26 |
| 0 | 0 | 57 | 96 | 94 | 95 | 93 | 38 |
| 0 | 0 | 55 | 93 | 95 | 92 | 96 | 36 |
| 0 | 0 | 8 | 19 | 18 | 19 | 17 | 9 |
| 0 | 0 | 0 | 0 | 0 | 0 | 0 | 0 |
| 0 | 0 | 0 | 0 | 0 | 0 | 0 | 0 |

FIG. 14A 50 56

| | | | | | | | |
|---|---|---|---|---|---|---|---|
| 0 | 0 | 0 | 0 | 0 | 0 | 0 | 0 |
| 0 | 0 | 40 | 275 | 285 | 220 | 0 | 0 |
| 0 | 0 | 95 | 465 | 480 | 385 | 0 | 0 |
| 0 | 0 | 90 | 475 | 470 | 370 | 0 | 0 |
| 0 | 0 | 95 | 460 | 475 | 380 | 0 | 0 |
| 0 | 0 | 85 | 480 | 465 | 375 | 0 | 0 |
| 0 | 0 | 45 | 180 | 190 | 120 | 0 | 0 |
| 0 | 0 | 0 | 0 | 0 | 0 | 0 | 0 |

FIG. 15

MULTI CHARGED PARTICLE BEAM WRITING METHOD AND MULTI CHARGED PARTICLE BEAM WRITING APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application is based upon and claims the benefit of priority from the prior Japanese Patent Application No. 2012-126368 filed on Jun. 1, 2012 in Japan, the entire contents of which are incorporated herein by reference.

BACKGROUND OF THE INVENTION

1. Field of the Invention

The present invention relates to a multi charged particle beam writing method and a multi charged particle beam writing apparatus, and for example, to a method of obtaining high accuracy of a plurality of irradiation positions of multiple beams.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with an electron beam.

As an example employing the electron beam writing technique, there is a writing apparatus using multiple beams (multi-beams). Compared with the case of writing a pattern by using a single electron beam, since a multi-beam writing apparatus can emit multiple radiation beams at a time, it is possible to greatly increase the throughput. In such a writing apparatus of a multi-beam system, for example, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample" (refer to, e.g., Japanese Patent Application Laid-open (JP-A) No. 2006-261342).

In such a writing apparatus of the multi-beam system, irradiation is performed with a plurality of beams at a time, and then, the irradiation positions of the multiple beams need to be highly precisely adjusted. For example, as to the size of a pattern to be written, it can be adjusted by altering the dimension of each beam by calibrating the reduction ratio of the lens in the optical system. However, if the lens condition is changed, a phenomenon such as a pattern rotation or a field distortion will occur. Therefore, it will be difficult to adjust the lens conditions to be in an optimized state together with a lot of other parameters necessary for the optical system to provide a highly accurate dimension. Then, if performing a rotation adjustment mechanically, it requires to accurately adjust a rotation position on the order of nm, which is not realistic. As to the field distortion, in the first place, there exists a theoretical field distortion in the optical system. For correcting this distortion, for example, it is necessary to perform a significantly accurate design in order to adjust a manufacturing accuracy of nm or below (e.g., 0.1 nm), which is also unrealistic. Moreover, even if the design is carried out highly precisely in the optical system design, restriction exists in the setting range of other design parameters. Therefore, if it is attempted to correct field distortion, there is a possibility of preventing the optimization of other conditions (for example, resolution performance, focus depth, and the like). Further, if it is attempted to attain equalization of a magnetic field in order to reduce distortion, an enormously large lens barrel will be needed, for example. Moreover, a lot of complicated correction systems are necessary for reducing the distortion, which may become an excessive burden to the apparatus. Furthermore, after manufacturing writing apparatuses, although adjustment for an actual apparatus becomes needed, since parameters for writing processing are intricately related to each other, a parameter for correcting distortion is not an independent variable even if the distortion is attempted to be corrected. Consequently, it will be difficult to execute the optimization or will take a lot of time even if the optimization can be performed.

As described above, in the writing apparatus of the multi-beam system, since irradiation is performed with a plurality of beams at a time, it is required to highly accurately adjust the irradiation positions of such multiple beams. In the multi-beam system, a pattern of a desired shape is formed by connecting the beams, which have been formed by passing through the same forming hole or different forming holes, at predetermined shot intervals by a raster scan method, for example. Thus, if a beam is shifted (deviated) from a desired irradiation position due to distortion of the optical system and the like, it becomes difficult to write a pattern highly precisely.

BRIEF SUMMARY OF THE INVENTION

In accordance with one aspect of the present invention, a multi charged particle beam writing method includes calculating first shot positions of multiple beams, each of the first shot positions including a distortion amount of an irradiating corresponding beam, in a case of irradiating each beam of multiple beams of a charged particle beam on a target object, based on control grid intervals having been set in length and width in advance, calculating first condition positions based on a pre-set condition, each of the first condition positions being arranged in a corresponding first region of a plurality of first regions respectively surrounded by closest second shot positions of 2×2 in length and width of the first shot positions, using the first shot positions including the distortion amount of the corresponding beam, calculating, for each of a plurality of second regions respectively surrounded by a plurality of closest second condition positions of the first condition positions, an area density of a figure pattern to be written in overlapping with a second region concerned in the plurality of second regions, by using the first condition positions, calculating an irradiation amount or an irradiation time of each beam whose corresponding first shot position of the first shot positions is in a corresponding second region of the plurality of second regions, based on an area density of a second region concerned, and writing a pattern on a target object by irradiating a beam of the irradiation amount or the irradiation time calculated.

In accordance with another aspect of the present invention, a multi charged particle beam writing apparatus includes a stage configured to mount a target object thereon and to be movable, an emission unit configured to emit a charged particle beam, an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings, a plurality of blankers configured to respectively perform blanking deflection of a corresponding beam in the multiple beams having passed through the plurality of openings of the aperture member, a blanking aperture member configured to block each beam that has been deflected to be in an off state by the plurality of blankers, a deflector configured to collectively deflect each beam having passed through the blanking aperture member to each irradiation position on the target object for the each beam having passed through the blanking aperture member, a shot position calculation unit configured to calculate first shot positions of multiple beams, each of the first shot positions including a distortion amount of an irradiating corresponding beam, in a case of irradiating each beam of multiple beams of a charged particle beam on a target object, based on control grid intervals having been set in length and width in advance, a condition position calculation unit configured to calculate first condition positions based on a pre-set condition, each of the first condition positions being arranged in a corresponding first region of a plurality of first regions respectively surrounded by closest second shot positions of 2×2 in length and width of the first shot positions, using the first shot positions including the distortion amount of the corresponding beam, an area density calculation unit configured to calculate, for each of a plurality of second regions respectively surrounded by a plurality of closest second condition positions of the first condition positions, an area density of a figure pattern to be written in overlapping with a second region concerned in the plurality of second regions, by using the first condition positions, an irradiation time calculation unit configured to calculate an irradiation time of each beam whose corresponding first shot position is in a corresponding second region of the plurality of second regions, based on an area density of a second region concerned, and a deflection control unit configured to perform blanking deflection control of the plurality of blankers so that each beam of the irradiation time calculated irradiates the target object.

BRIEF DESCRIPTION OF THE DRAWINGS

FIG. 10 is a schematic diagram showing an example of a shot position data map according to Embodiment 1;

FIG. 12 is a schematic diagram showing an example of shot region mesh data according to Embodiment 1;

FIGS. 14A and 14B show examples of an area density map according to Embodiment 1;

FIG. 15 shows an example of an irradiation time map according to Embodiment 1;

DETAILED DESCRIPTION OF THE INVENTION

Embodiment 1

In the following Embodiment, there will be described a writing apparatus and method that can suppress change of a pattern shape or a dimension caused by deviation of irradiation positions of multiple beams due to distortion of the optical system and the like.

Moreover, in the following Embodiment, there will be described a configuration in which an electron beam is used as an example of a charged particle beam. However, the charged particle beam is not limited to the electron beam, and other charged particle beam such as an ion beam may also be used.

Figure 1:
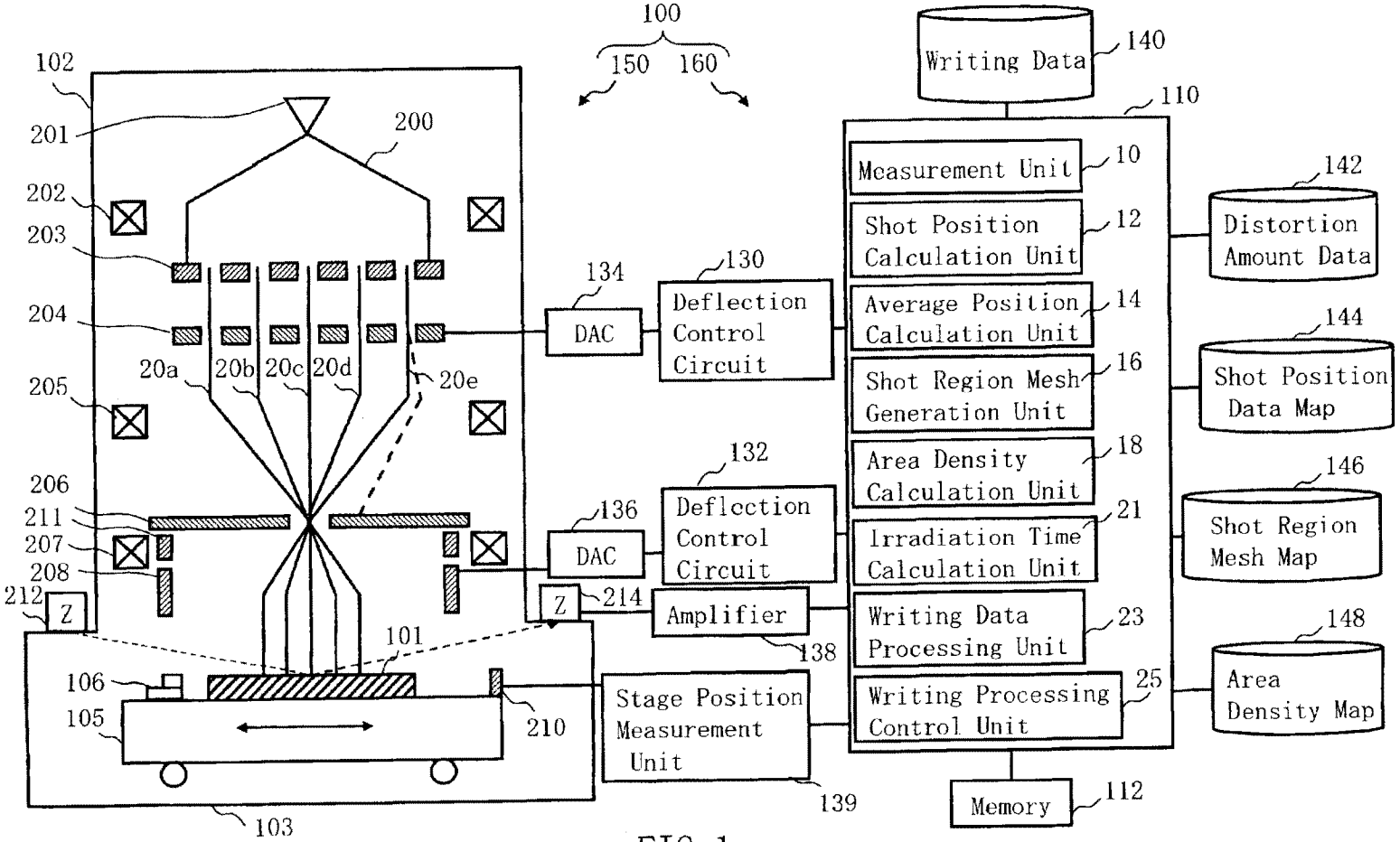
FIG. 1 is a schematic diagram showing a configuration of a writing apparatus according to Embodiment 1.

FIG. 1 is a schematic diagram showing a configuration of a writing apparatus according to Embodiment 1. In FIG. 1, a writing (or "drawing") apparatus 100 includes a writing unit 150 and a control unit 160. The writing apparatus 100 is an example of a multi charged particle beam writing apparatus. The writing unit 150 includes an electron lens barrel 102 and a writing chamber 103. In the electron lens barrel 102, there are arranged an electron gun assembly 201, an illumination lens 202, an aperture member 203, a blanking plate 204, a reducing lens 205, a limiting aperture member 206, an objective lens 207, a deflector 208, and an electrostatic lens 211. An XY stage 105 is arranged in the writing chamber 103, and a projector 212 of Z sensor and an optical receiver 214 of Z sensor are arranged on the writing chamber 103. The projector 212 and the optical receiver 214 may be arranged in the writing chamber 103 or the electron lens barrel 102. On the XY stage, there is placed a target object or "sample" 101 such as a mask serving as a writing target substrate. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. On the XY stage 105, there are arranged a mark 106 and a mirror 210 for measuring a position. The mark 106 has several measuring planes of different heights, for example.

The control unit 160 includes a control computer 110, a memory 112, deflection control circuits 130 and 132, digitalto-analog converter (DAC) amplifiers 134 and 136, an amplifier 138, a stage position measurement unit 139, and storage devices 140, 142, 144, 146, and 148 such as magnetic disk drives. The control computer 110, the memory 112, the deflection control circuits 130 and 132, the amplifier 138, the stage position measurement unit 139, and the storage devices, 140, 142, 144, 146, and 148 are mutually connected through a bus (not shown). Writing data is input into the storage device 140 (storage unit) from the outside to be stored therein.

In the control computer 110, there are arranged a measurement unit 10, a shot position calculation unit 12, an average position calculation unit 14, a shot region mesh generation unit 16, an area density calculation unit 18, an irradiation time calculation unit 21, a writing data processing unit 23, and a writing processing control unit 25. Then, each function of them may be configured by hardware such as an electronic circuit, or by software such as a program implementing these functions. Alternatively, they may be configured by a combination of software and hardware. Data which is input and output to/from the measurement unit 10, the shot position calculation unit 12, the average position calculation unit 14, the shot region mesh generation unit 16, the area density calculation unit 18, the irradiation time calculation unit 21, the writing data processing unit 23, and the writing processing control unit 25, and data being calculated are stored in the memory 112 each time.

As described above, FIG. 1 shows a structure necessary for explaining Embodiment 1. Other structure elements generally necessary for the writing apparatus 100 may also be included. For example, according to Embodiment 1, as will be described later, the irradiation time calculation unit 21 performs calculation of an irradiation time simultaneously with calculation of a dose (irradiation amount) of each shot, but however, it is not limited thereto. For example, it is also preferable that a dose calculation unit that calculates a dose and an irradiation time calculation unit that calculates an irradiation time using the calculated dose are separately included.

Figure 2A:
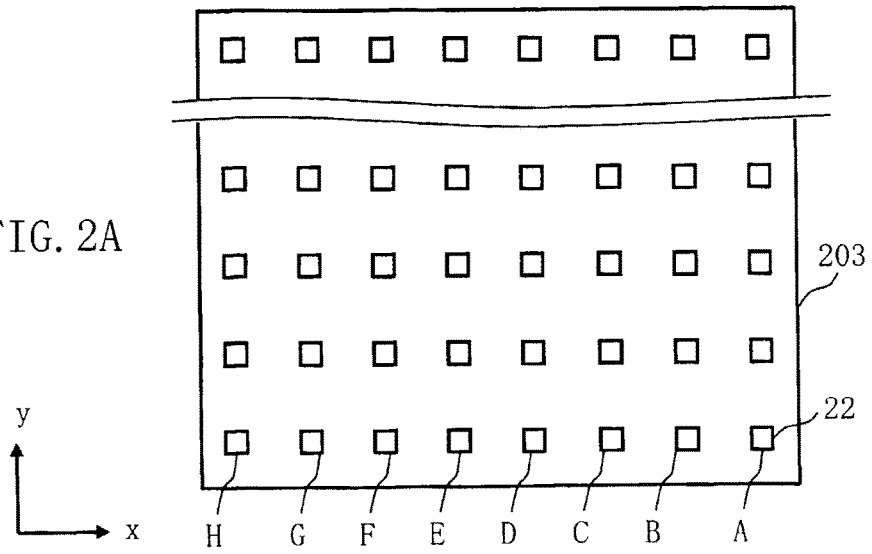
FIGS. 2A and 2B are schematic diagrams each showing an example of a configuration of an aperture member according to Embodiment 1.
Figure 2B:
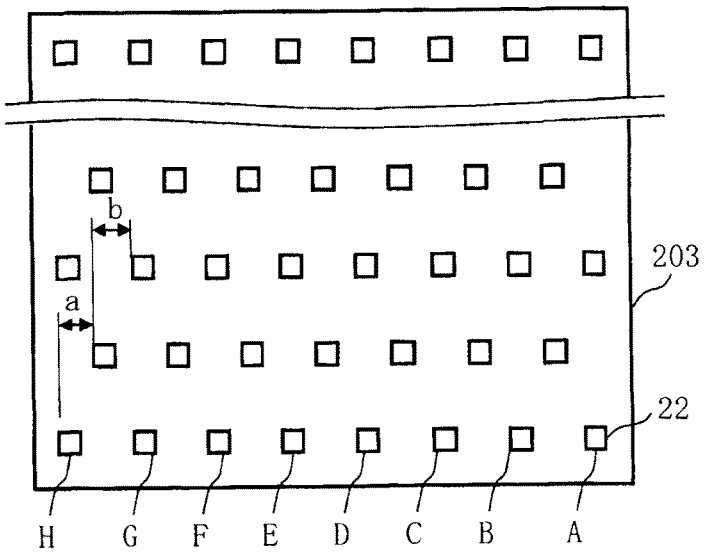

FIGS. 2A and 2B are schematic diagrams each showing an example of the configuration of an aperture member according to Embodiment 1. In FIG. 2A, holes (openings) 22 are formed at a predetermined arrangement pitch in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 is a quadrangle of the same dimensions and shape. Alternatively, each hole may be a circle of the same circumference. In this case, there is shown an example of each row having eight holes 22 from A to H in the x direction. Multi-beams 20 are formed by letting portions of an electron beam 200 respectively pass through a corresponding hole of a plurality of holes 22. Here, there is shown the case where the holes 22 are arranged in a plurality of columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
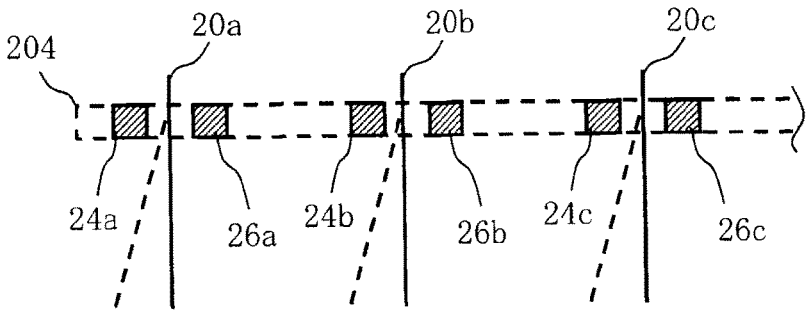
FIG. 3 is a schematic diagram showing a configuration of a blanking plate according to Embodiment 1.

FIG. 3 is a schematic diagram showing the configuration of a blanking plate according to Embodiment 1. In the blanking plate 204, a passage hole is formed to be corresponding to the arrangement position of each hole 22 of the aperture member 203, and a pair of electrodes 24 and 26 (blanker) is arranged for each passage hole. The electron beams 20 respectively passing through a corresponding passage hole are deflected by that voltage is independently applied to the two electrodes 24 and 26 being a pair, or by that voltage is applied to either one of them and the other one is connected to the earth (ground). Blanking control is performed by this deflection. Thus, a plurality of blankers respectively perform blanking deflection of a corresponding beam in the multiple beams having passed through a plurality of holes 22 (openings) of the aperture member 203.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes of the aperture member 203 is irradiated with the electron beam 200. For example, a plurality of quadrangular electron beams (multiple beams) 20a to 20e are formed by letting parts of the electron beam 200 pass through a corresponding hole of the plurality of holes of the aperture member 203 respectively. The multiple beams 20a to 20e respectively pass through a corresponding blanker of the blanking plate 204. Each blanker deflects the electron beam 20 which is passing therethrough. The sizes of the multiple beams 20a to 20e having passed through the blanking plate 204 are reduced by the reducing lens 205, and advance toward a hole at the center of the limiting aperture member 206. At this point, the electron beam 20 which was deflected by the blanker of the blanking plate 204 is deviated from the hole of the center of the limiting aperture member 206 (blanking aperture member) and is blocked by the limiting aperture member 206. On the other hand, the electron beam 20 which was not deflected by the blanker of the blanking plate 204 passes through the hole at the center of the limiting aperture member 206. Blanking control is performed by on/off of the blanker so as to control on/off of the beam. Thus, the limiting aperture member 206 blocks each beam which was deflected to be in the "beam off" state by each of a plurality of blankers. Then, one-time shot beam of multiple beams is formed by a beam which has been formed during from the "beam on" state to the "beam off" state and has passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, the multi-beams 20 to irradiate at a time are aligned at a pitch obtained by multiplying the arrangement pitch of a plurality of holes of the aperture member 203 by a desired reduction ratio described above. The writing apparatus 100 performs a writing operation by the raster scan method which continuously irradiates shot beams in order. When writing a desired pattern, an unnecessary beam is controlled by blanking control to be "beam off". With the recent miniaturization and high integration of semiconductors, it is required to perform pattern writing highly accurately. In order to satisfy this requirement, performance such as a control grid (AU) of 10 nm, a beam size of 20 nm×20 nm, and a beam resolution σ of 10 nm, as an example, is needed for a writing apparatus.

Figure 4A:
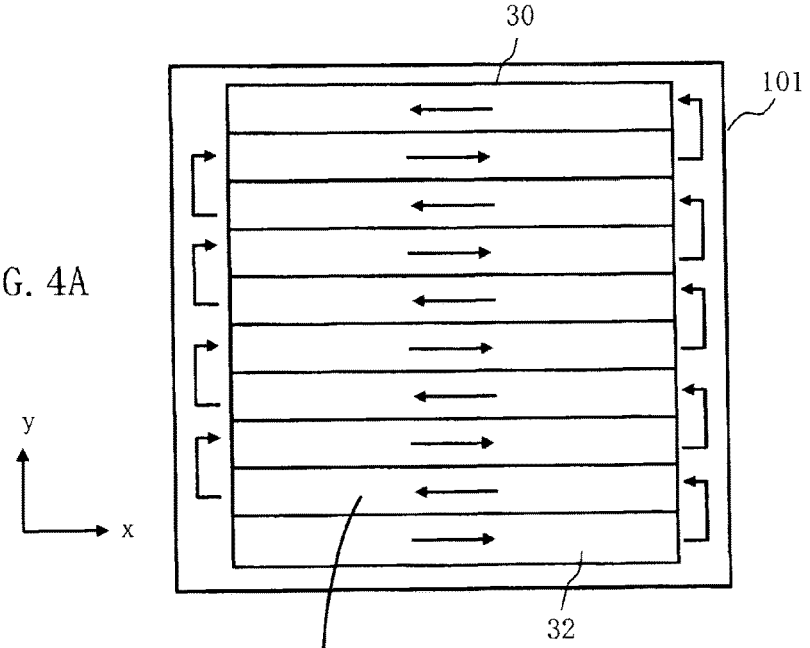
FIGS. 4A to 4C are schematic diagrams explaining a writing operation according to Embodiment 1.
Figure 4B:
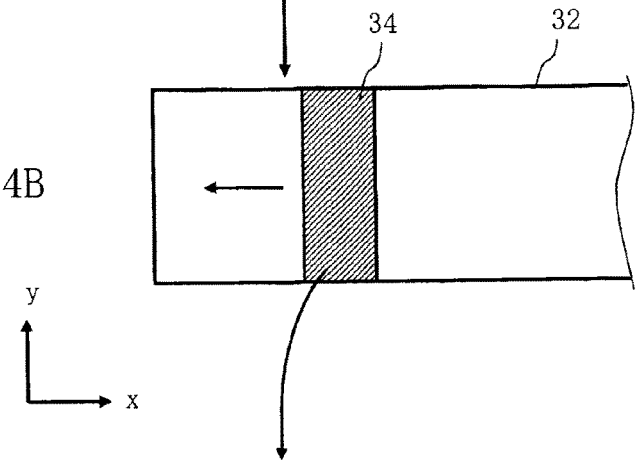
Figure 4C:
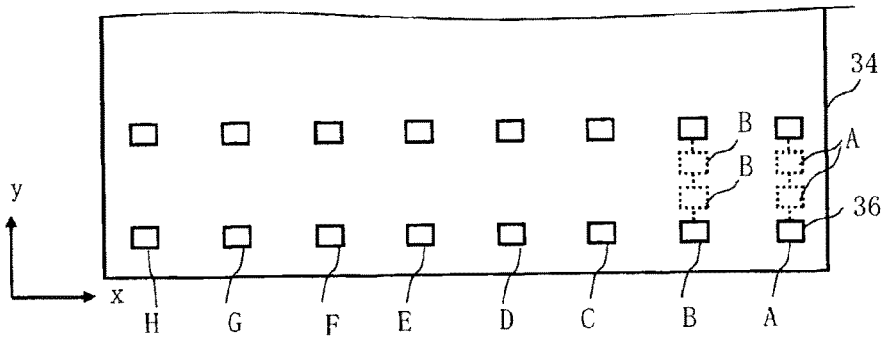

FIGS. 4A to 4C are schematic diagrams explaining a writing operation according to Embodiment 1. As shown in FIG. 4A, a writing region 30 of the target object 101 is virtually divided into a plurality of strip-shaped stripe regions 32 each having a predetermined width in the y direction, for example. Each of the stripe regions 32 serves as a writing unit region. First, the XY stage 105 is moved and adjusted such that an irradiation region 34 to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the −x direction, for example. The XY stage 105 is continuously moved at a predetermined speed, for example. After writing the first stripe region 32, the stage position is moved in the −y direction and adjusted such that the irradiation region 34 is located at the right end of the second stripe region 32 or at a position more right than the right end and located to be relatively in the y direction. Then, similarly, as shown in FIG. 4B, writing advances in the −x direction by moving the XY stage 105 in the x direction, for example. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also acceptable to perform writing in the same direction when writing each stripe region 32. Then, when writing each stripe 32, the raster scan method is employed wherein while the XY stage 105 is moved in the x direction, the deflector 208 performs deflection such that each shot moves (scans) in the y direction in order and the shot beam radiation is continuously performed in order. For example, the deflector 208 performs deflection in the x direction to follow the movement speed of the XY stage 105 such that each shot moves (scans) in the y direction in order. Thus, as shown in FIG. 4C, with respect to a shot pattern 36 by a beam having passed through one hole A of the aperture member 203, the beams are irradiated in order while being deviated in the y direction from the position irradiated for the first time. Similarly, with respect to another shot pattern 36 by a beam having passed through one hole B of the aperture member 203, the beams are irradiated in order while being deviated in the y direction from the position irradiated for the first time. Similarly, with respect to each shot pattern 36 by a beam respectively having passed through each of the holes C to H of the aperture member 203, the beams are irradiated in order while being deviated in the y direction from the position irradiated for the first time. Thus, writing is performed in each region surrounded by beams of 2×2 in length and width, which are irradiated at one time, by the raster scan method (technique). Each region surrounded by beams of 2×2 in length and width which are irradiated at one time is a quadrangle formed such that one beam position being a reference is included and other three remaining beam positions are not included, in spite of the four beam positions being four corner points, and the area of the quadrangle becomes the largest, for example.

Figure 5:
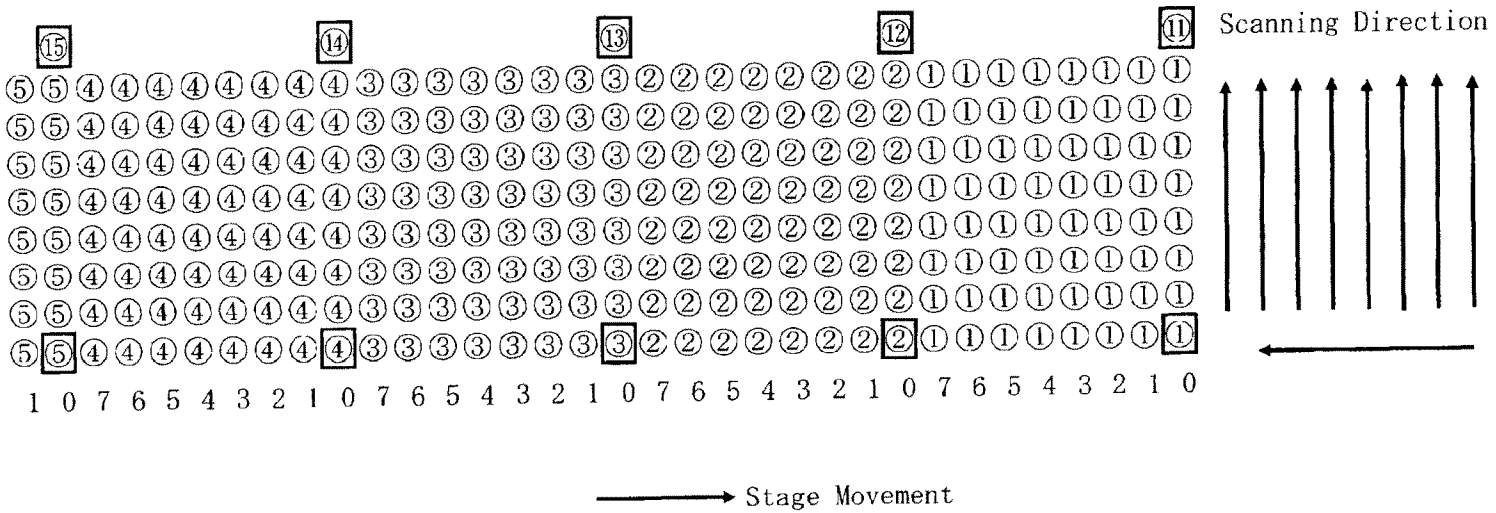
FIG. 5 is a schematic diagram explaining a writing operation of raster scanning according to Embodiment 1.

FIG. 5 is a schematic diagram explaining a writing operation of raster scanning according to Embodiment 1. For example, in the case there are eight holes A to H formed in the x direction in the aperture member 203, each region surrounded by beams of 2×2 in length and width, which are irradiated at a time, is irradiated with beams of a plurality of shot times while the stage moves between the shot patterns 36 located adjacent to each other in the x direction and irradiated at a time. Only the part concerning the holes A to E is shown in the figure. AUs (Address Units) are control grids arranged in a grid shape, and the size between the control grids is a predetermined quantization size. For example, the size between AUs is set such that each region surrounded by beams of 2×2 in length and width, irradiated at a time, is to be a size of nAU×nAU. While the stage is moving, each region surrounded by beams of 2×2 in length and width is irradiated by beam shots of n times at shot intervals less than or equal to the AU (control grid) intervals. In this case, the ideal size of each region surrounded by beams of 2×2 in length and width, which are irradiated at a time, is set to be eight AUs x eight AUs, and while the stage is moving, each region surrounded by beams of 2×2 in length and width is shot by beam irradiation of eight times at the AU intervals. Even when each shot is controlled to be at an interval of AU, the shot position may be actually shifted due to field distortion and the like. In such a case, in order to avoid poor precision caused by that the shot interval becomes greater, it is preferable to control the shot interval in advance to be less than or equal to a specified interval (AU).

In FIG. 5, the number "1" surrounded by a circle indicates a position shot by a beam having passed through the hole A of the aperture member 203. The number "2" surrounded by a circle indicates a position shot by a beam having passed through the hole B of the aperture member 203. The number "3" surrounded by a circle indicates a position shot by a beam having passed through the hole C of the aperture member 203. The number "4" surrounded by a circle indicates a position shot by a beam having passed through the hole D of the aperture member 203. The number "5" surrounded by a circle indicates a position shot by a beam having passed through the hole E of the aperture member 203. Further, in the part not shown in the figure, the number "6" surrounded by a circle indicates a position shot by a beam having passed through the hole F of the aperture member 203. The number "7" surrounded by a circle indicates a position shot by a beam having passed through the hole G of the aperture member 203. The number "8" surrounded by a circle indicates a position shot by a beam having passed through the hole H of the aperture member 203. Moreover, in FIG. 5, the numbers "11" to "15" respectively indicate other holes located at one step upper in the y direction than the holes A to H of the aperture member 203. The positions each surrounded by a square respectively indicate the positions of the holes A to H, for example, of the aperture member 203. Shot patterns 36 formed by beams respectively having passed through the holes A to H of the aperture member 203 are irradiated at the positions ideally away from each other by a pitch between beams. If the stage is moved n times (in this case, 8 times) the length of the pitch between beams while performing shooting n times (in this case, 8 times) at intervals of AU (control grid) as the pitch between beams, the inside of each region surrounded by beams of 2×2 in length and width, which are irradiated at a time, is to be filled with shot patterns 36 formed by beams respectively having passed through the holes A to H of the aperture member 203 as shown in FIG. 5. If beams of unnecessary shots among these shots are turned off to coincide with the shape of a pattern to be written, a pattern of a desired shape can be written on the target object 101 by connecting the remaining shot patterns 36 each other.

In FIG. 5, controlling is performed such that the stage is moved in the +x direction and the whole of the beams are scanned in the y direction orthogonal to the +x direction while performing deflection in the x direction in order to follow (track) the movement speed of the XY stage 105. This state is conceptually shown with the arrows at the right side of FIG. 5. FIG. 5 shows the case by the arrow where the deflection operation in the x direction for following the stage movement is performed by a deflector (not shown) other than the deflector 208, but however, it may be performed by the deflector 208.

Moreover, the timing of starting scanning is denoted by T=0 to T=7 on the basis of T=0, at the position under the opening (hole) position of the aperture. FIG. 5 shows typical writing positions where each beam starts scanning when T=0. In this example, by performing y-scanning to follow the stage movement in the +x direction, the whole surface is to be filled with beam shots while the writing position is relatively kept at the same position. After the 0-th y-direction scanning at T=0, the beam position has been shifted to the adjoining beam position. Then, a tracking deflector or the deflector 208 performs deflection-control so that the beam position may be returned to a position deviated by one AU (in the −x direction) from the original beam position, and then, the first (T=1) scanning starts from this position. The stage movement speed is controlled so that the beam position may be shifted to the adjoining beam position when the first y-scanning has been finished. Various patterns can be written depending on a dose applied to each beam shot. As described above, by performing a deflection operation in the x direction to follow the stage movement by another deflector, it is sufficient for the deflector 208 to perform deflection in the y direction of the scanning width, and therefore, the resolution can be increased. Alternatively, the stage speed may be controlled so that when the first y-scanning has been finished, the beam position may be shifted by one AU in the −x direction.

In FIG. 5, the deflector 208 deflects so that each shot may be moved (scan) in the y direction in order while performing deflection to follow (track) the movement speed of the XY stage 105 in the x direction (in this case, −x direction). After finishing irradiation of beams of n shots in the y direction, it is moved to a position shifted by a shot interval which has been set in advance in the −x direction, and similarly, the deflector 208 deflects so that each shot may be moved (scan) in the y direction in order while performing deflection to follow (track) the movement speed of the XY stage 105 in the x direction. By performing this operation n times, the inside of each region surrounded by the beams of 2×2 in length and width, which are irradiated at a time, is to be filled with shot patterns 36 formed by beams respectively having passed through the holes A to H of the aperture member 203 as shown in FIG. 5. As described above, by performing a tracking control to follow the stage speed, the writing processing which is the same as the so-called "step and repeat" operation can be performed.

Figure 6:
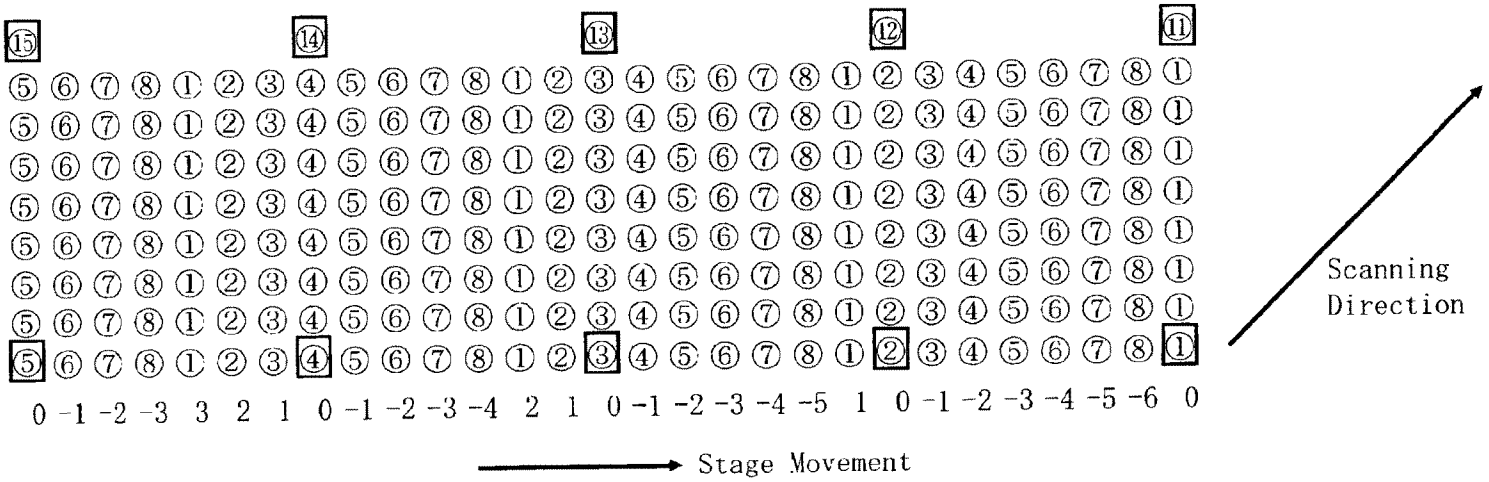
FIG. 6 shows a schematic diagram explaining another example of the raster scan writing operation according to Embodiment 1.

FIG. 6 shows a schematic diagram explaining another example of a raster scan writing operation according to Embodiment 1. In FIG. 6, the relation between the number surrounded by the circle and the position of each hole of the aperture member 203 is the same as that of FIG. 5 (similarly to FIG. 5, only the part of the holes A to E is shown). Moreover, "11" to "15" respectively indicate other holes located at one step upper in the y direction than the holes A to H of the aperture member 203. The positions each surrounded by a square respectively indicate the positions of the holes A to H, for example, of the aperture member 203. FIG. 6 shows a modified example of FIG. 5. In FIG. 6, controlling is performed such that the stage is moved in the +x direction and the whole of the beams are scanned in the y direction orthogonal to the x direction while performing deflection in the x direction in order to follow (track) the movement speed of the XY stage 105. FIG. 6 shows the case by the arrow where the deflection operation in the x direction for following the stage movement is performed by the deflector 208. Moreover, the timing of starting scanning is denoted by T=−6 to T=3 on the basis of T=0, at the position under the opening (hole) position of the aperture. After the 0th (T=0) y scanning is finished, the origin point position (scanning starting position) coincides with the position shifted in the −x direction by one AU from the 0th scanning starting position (T=0) of the beam having passed through the left side hole in the example of FIG. 6. In other words, the speed of the stage is controlled in such a manner. It is preferable to control the interval between the beams to be seven AUs. By this, it is possible to start y-scanning in the state where the first scanning starting position (T=1) is deviated to the left (in the −x direction) by one control unit (one AU) in order not to overlap with the writing position of the beam of the left hole. This processing is repeated in series. By this operation, it is sufficient for the deflector 208 to perform deflection in the x direction with a deflection width being the same as the scanning width in the y direction, and therefore, the resolution can be increased.

As FIGS. 5 and 6 have shown examples of the irradiation position of each shot, various scanning methods combined with the movement of the stage can be selected. Although the method of performing writing by only the y-direction scanning has a merit in that control may be simple, flexibility is not sufficient because there is no x direction scanning. By contrast, the method where x and y directions scanning are combined has a merit in that there are more options. For example, by changing the scanning method as shown in the examples of FIGS. 5 and 6, it is possible to perform writing while changing the number of shots between beams (that is, changing the control unit). These should just be selected according to a design requirement.

As described above, in the writing processing, although it is ideal that irradiation of each beam is delivered to each shot position at a pre-set shot interval, a beam irradiation position of each shot is actually deviated from a desired shot position due to distortion caused by various factors. As factors of distortion, there are, for example, a deflection distortion (optical distortion) resulting from the change of the lens conditions and the like as described above, a field distortion (transfer/print distortion) that theoretically exists depending upon design precision, installation position accuracy, etc. of the optical system parts, and a distortion (Z correction distortion) generated by expansion/reduction and rotation of an image when dynamically adjusting (Z position correction) a beam focal position because of irregularity of the writing surface of the target object 101. Moreover, besides these, there may exist distortion due to other factor. Thus, a shot position is deviated by distortion resulting from these factors, and therefore, a positional deviation and a shape accuracy degradation of a desired pattern may occur.

Then, according to Embodiment 1, a positional deviation amount of a shot position resulting from these distortion is calculated in advance, and a dose (irradiation time) of a beam of each shot is set based on the shot position in which the positional deviation due to such distortion is taken into account. Thereby, even if distortion occurs, since the dose has already been adjusted considering it, a written pattern has been highly accurately formed as a result.

Figure 7:
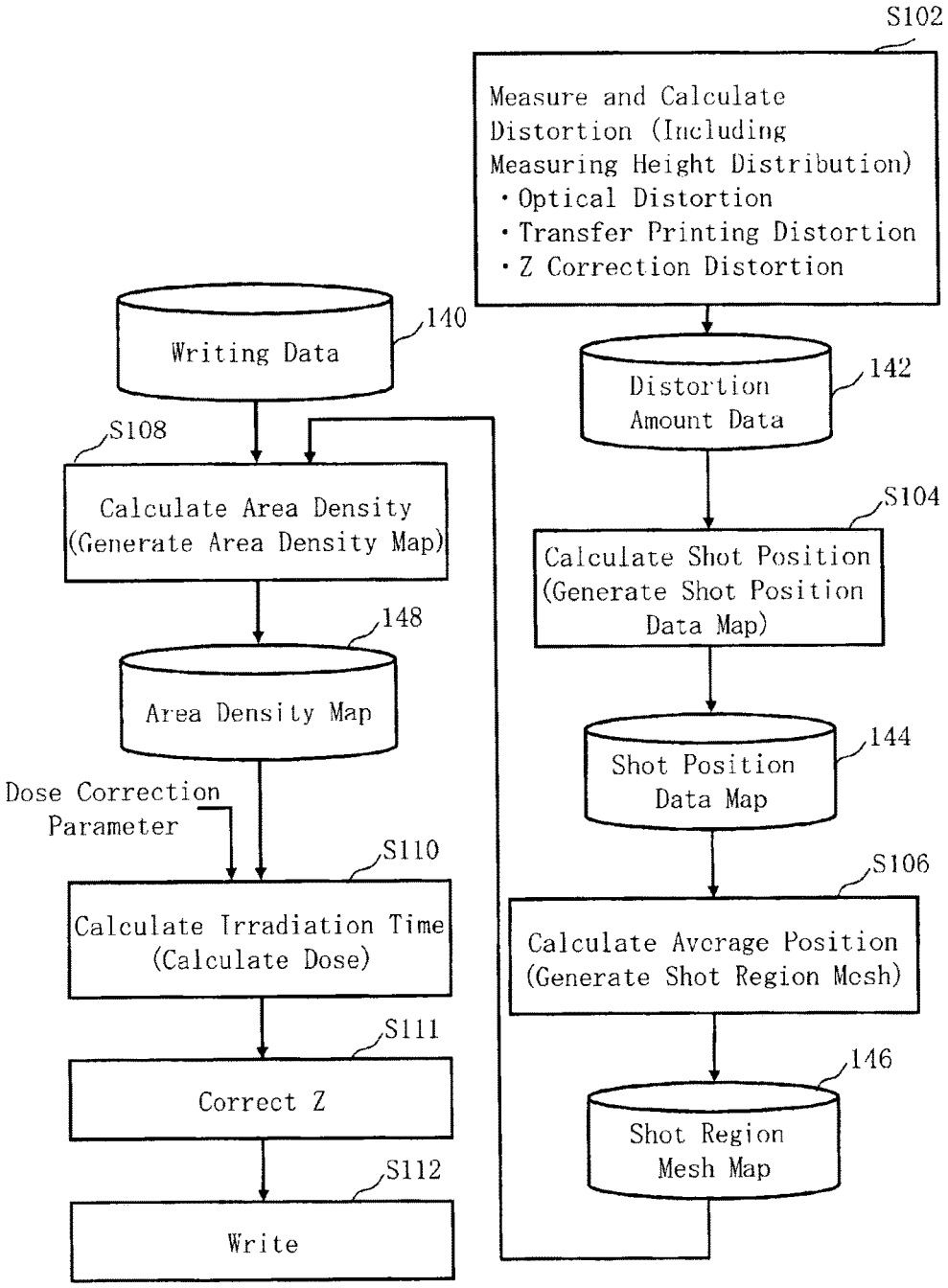
FIG. 7 is a flowchart showing main steps of a writing method according to Embodiment 1.

FIG. 7 is a flowchart showing main steps of a writing method according to Embodiment 1. In FIG. 7, the writing method according to Embodiment 1 executes a series of steps: a distortion measurement/calculation step (S102), a shot position calculation step (S104), an average position calculation step (S106), an area density calculation step (S108), an irradiation time calculation step (S110), a Z correction step (S111) and a writing step (S112). As a pre-processing step before writing, for example, the distortion measurement step (S102), the shot position calculation step (S104), and the average position calculation step (S106) are performed. Then, using a result of the pre-processing step before writing, the area density calculation step (S108), the irradiation time calculation step (S110), the Z correction step (S111), and the writing step (S112) are executed as a writing processing step. However, it is not limited thereto, and all or a part of the pre-processing step before writing may be performed in the processing step.

First, in the distortion measurement/calculation step (S102), the measurement unit 10 measures an amount of distortion caused by each factor. In this case, the above-described optical distortion, field distortion (transfer printing distortion), and Z correction distortion are measured and calculated, for example. Such an amount of distortion may be measured by a conventional method. For example, a distortion amount at each position on the evaluation substrate is measured by writing an evaluation substrate by using the writing apparatus 100 so as to generate a distortion amount map. Alternatively, fitting is performed for an amount of distortion at each position on the evaluation substrate by a polynomial, to acquire a distortion amount computing equation. Moreover, it is possible to measure a distortion by performing scanning with a beam to measure the position of a mark placed on the stage.

Figure 8:
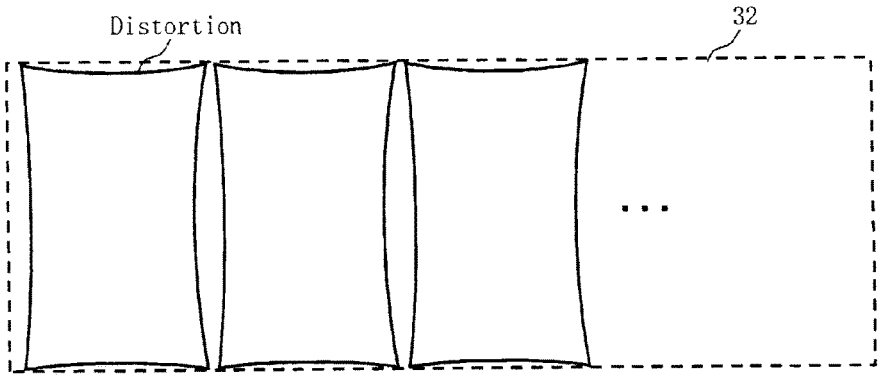
FIG. 8 is a schematic diagram showing an example of field distortion according to Embodiment 1.

FIG. 8 is a schematic diagram showing an example of field distortion according to Embodiment 1. FIG. 8 shows an example of a field distortion of the irradiation region 34 in the stripe region 32. This example of the field distortion occurs, for example, in the case of writing each irradiation region 34 by the scanning method of FIG. 5. In such a case, for example, a distortion amount may be defined based on a relative coordinate measured from the field origin point (origin point of control) which is set for each irradiation region 34. It should be understood that the whole of the writing region of the target object 101 or a stripe region unit may be defined as one coordinate system.

With respect to the Z correction, first, a voltage applied to the electrostatic lens 211 in the case of focusing on one plane of a plurality of measuring planes of the mark 106 having different heights is measured, and another voltage applied to the electrostatic lens 211 in the case of focusing on another measuring plane is also measured. Moreover, an expansion/reduction amount and a rotation amount of an image in the case of focusing on the height position of each measuring plane are measured. The expansion/reduction amount and the rotation amount of an image at each focal position may be measured by actually performing writing onto the evaluation substrate whose writing surface is set to coincide with the height position of each measuring plane. Since the height positions of a plurality of measuring planes of the mark 106 are known in advance, a voltage applied to the electrostatic lens 211 at each height of the target object surface can be calculated by a linear proportion. Similarly, the expansion/reduction amount and the rotation amount of an image at each height can be calculated. Specifically, it is possible to obtain coefficients each indicating an expansion/reduction amount or a rotation amount corresponding to the height position of the target object 101.

Next, a height position distribution of the writing surface of the target object 101 used as a writing target is measured. The height of the writing surface of the target object 101 is measured, for each stripe region 32, by emitting a laser from the projector 212 to irradiate, for example, the optical-axis position of the target object surface and receiving the reflected light by the optical receiver 214 while the XY stage 105 is being moved. The output of the optical receiver 214 is converted into digital data by the amplifier 138, and output to the measurement unit 10. Thereby, the height distribution of the target object 101 can be measured. Then, a Z correction distortion amount map is generated by calculating a Z correction distortion amount at each position by multiplying the height distribution by an acquired coefficient. Alternatively, a computing equation for a Z correction distortion amount is acquired by fitting a Z correction distortion amount at each position on the evaluation substrate by a polynomial.

The distortion amount map or distortion amount data obtained by the distortion amount computing equation is stored in the memory 142. The distortion amount data may be generated according to a factor of distortion or a distortion amount of each factor may be added (synthesized) to be collected.

In the shot position calculation step (S104), the shot position calculation unit 12 calculates shot positions (first shot positions) of multiple beams, each of the shot positions including a distortion amount of each beam to irradiate in the case of irradiating each beam onto the target object 101 at shot intervals less than or equal to the control grid (AU) intervals which has been set in length and width in advance by using the multi-beam 20 of an electron beam. Specifically, the shot position of each beam in the case of writing the whole writing region surface of the target object 101 with the multi-beam 20 is calculated. In the calculating, the shot position calculation unit 12 reads distortion amount data from the storage device 142, and obtains a distorted position R(x, y) by using each design shot position coordinate r(x, y). In the case of using the distortion amount map, what is necessary is to calculate a distorted position R(x, y) by performing a linear interpolation on r(x, y) by a surrounding map value, for example. In the case of using a distortion amount computing equation, what is necessary is to substitute r(x,y) in the distortion amount computing equation in order to calculate a distorted position R(x, y). As to the shot position of each beam whose size is finite, such as from 10 nm to 20 nm, it is preferable to define it as the central position of a beam or the center of gravity position when especially the intensity distribution has asymmetry.

Figure 9:
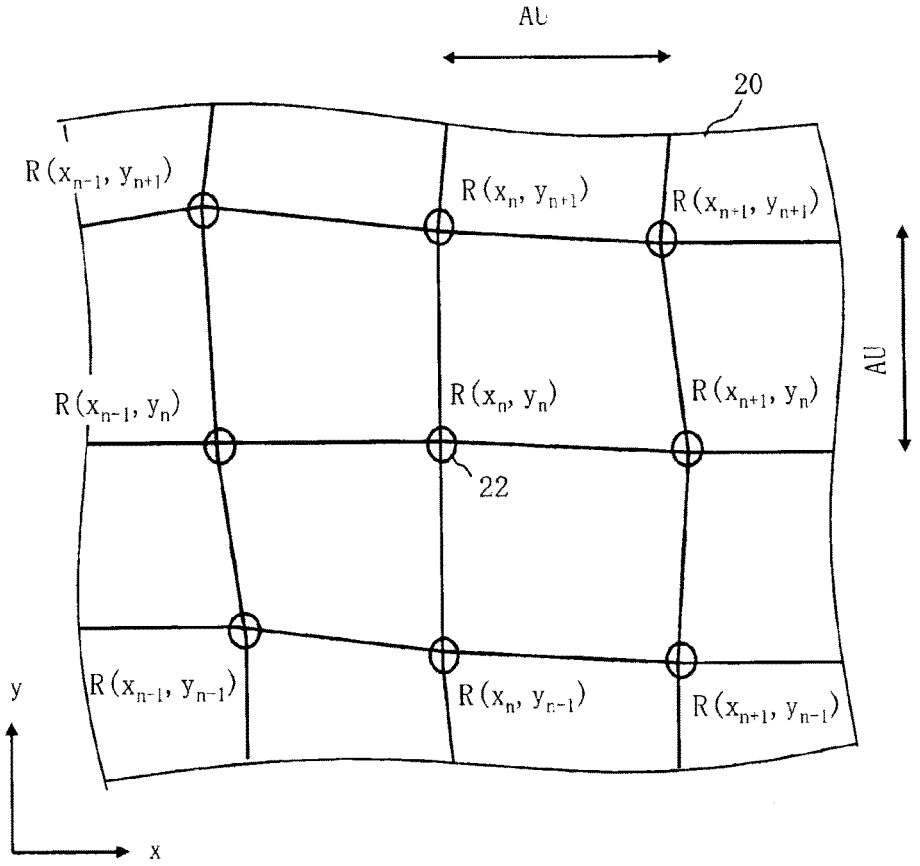
FIG. 9 is a schematic diagram showing an example of a shot position according to Embodiment 1.

FIG. 9 is a schematic diagram showing an example of a shot position according to Embodiment 1. FIG. 9 shows a shot position 22 of each beam at a partial region of the writing region of the target object 101. If there is no distortion, each beam should be equally arranged at shot intervals having been set in length and width, but when distortion exists, as shown in FIG. 9, a deviation occurs at the coordinate R of the shot position 22 of each beam. Depending on the amount of deviation, there is a possibility of a shot interval becoming less than AU such as the shot interval between the shot position 22 of coordinate R($x_{n+1}$, $y_{n+1}$) and the shot position 22 of coordinate $R(x_n, y_{n+1})$, for example. Moreover, there is a possibility of a shot interval becoming greater than AU such as the shot interval between the shot position 22 of coordinate $R(x_n, y_n)$ and the shot position 22 of coordinate $R(x_{n+1}, y_n)$. Here, it is concerned that precision degrades because of the shot interval becoming greater than AU, and, in such a case, the degradation of precision can be avoided by making the shot interval less than AU beforehand. The shot position data calculated as described above is stored as a shot position data map in the storage device 144, for example.

FIG. 10 is a schematic diagram showing an example of the shot position data map according to Embodiment 1. In the shot position data map, each shot position coordinate R(x, y) in which a distortion amount is included is defined as a map value as shown in FIG. 10, for example.

In the average position calculation step (S106), the average position calculation unit 14, using the shot position R in which a distortion amount of each beam is included, calculates condition positions (first condition positions) based on pre-set conditions, each of the first condition positions being arranged in a corresponding each region (the first region) of a plurality of regions (the first regions) respectively surrounded by the shot positions (second shot positions of the first shot positions) of the closest beams of 2×2 in length and width. It is preferable for this condition position to be the average position of a plurality of regions (the first regions) or the position of the center of gravity. In this case, an average position is calculated, for example.

Figure 11:
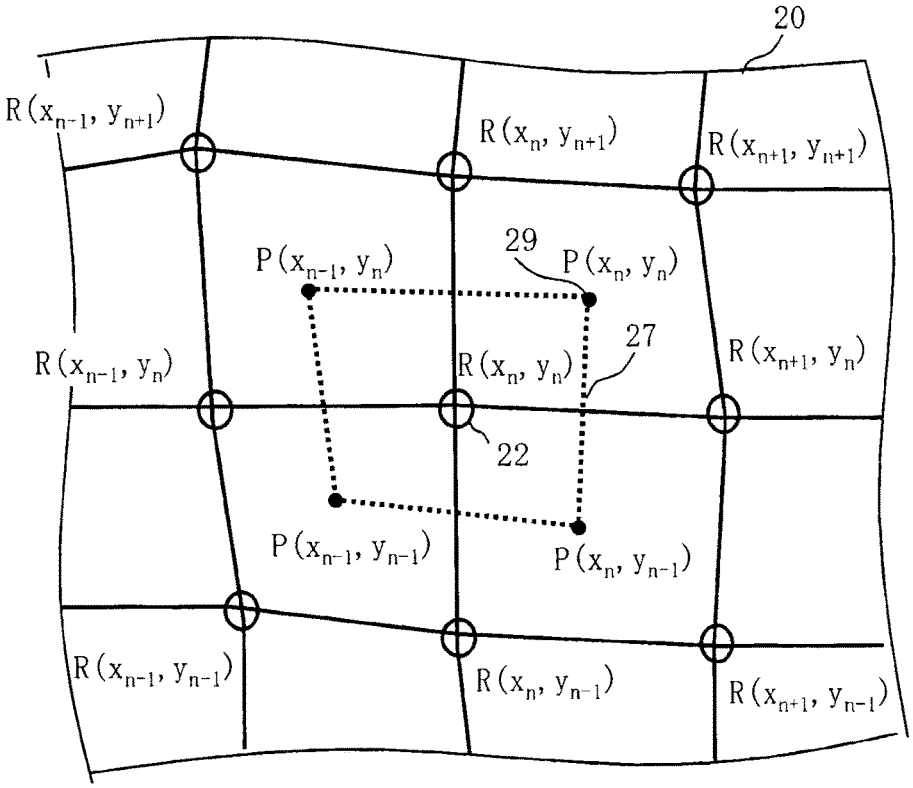
FIG. 11 is a schematic diagram showing an example of a shot region mesh according to Embodiment 1.

FIG. 11 is a schematic diagram showing an example of a shot region mesh according to Embodiment 1. For example, the coordinate $P(x_n, y_n)$ of an average position 29 of a region surrounded by the shot positions 22 of 2×2 in length and width designated by the coordinate $R(x_n, y_n)$, the coordinate $R(x_{n+1}, y_n)$, the coordinate $R(x_n, y_{n+1})$, and the coordinate $R(x_{n+1}, y_{n+1})$ is calculated. The x-coordinate value of the coordinate $P(X_n, y_n)$ can be calculated by dividing the sum of the added x-coordinate values of the shot positions 22 by 4. Similarly, the y-coordinate value of the coordinate $P(x_n, y_n)$ can be calculated by dividing the sum of the added y-coordinate values of the shot positions 22 by 4. In the same way, the coordinate $P(x_{n-1}, y_n)$ of the average position 29 of a region surrounded by the shot positions 22 of 2×2 in length and width designated by the coordinate $R(x_n, y_n)$, the coordinate $R(x_{n-1}, y_n)$, the coordinate $R(x_{n-1}, y_{n+1})$, and the coordinate $R(x_n, y_{n+1})$ is calculated. In the same way, the coordinate $P(x_{n-1}, y_{n-1})$ of the average position 29 of a region surrounded by the shot positions 22 of 2×2 in length and width designated by the coordinate $R(x_n, y_n)$, the coordinate $R(x_{n-1}, y_n)$, the coordinate $R(x_{n-1}, y_{n-1})$, and the coordinate $R(x_n, y_{n-1})$ is also calculated. In the same way, the coordinate $P(x_n, y_{n-1})$ of the average position 29 of a region surrounded by the shot positions 22 of 2×2 in length and width designated by the coordinate $R(x_n, y_n)$, the coordinate $R(x_n, y_{n-1})$, the coordinate $R(x_{n+1}, y_{n-1})$, and the coordinate $R(x_{n+1}, y_n)$ is also calculated.

By this, it is possible to define the shot region 27 (the second region) surrounding the shot position coordinate $R(x_n, y_n)$ which is surrounded by each of the average positions 29 designated by the coordinate $P(x_n, y_n)$, the coordinate $P(x_{n-1}, y_n)$, the coordinate $P(x_{n-1}, y_{n-1})$, and the coordinate $P(x_n, y_{n-1})$. Since the shot region 27 is surrounded by the average values of the shot positions in which a distortion amount is taken into account, it is not a right angle quadrangle such as a square or a rectangle in many cases, as shown in FIG. 11. As mentioned later, a highly precise dose can be calculated by using the shot region 27 which is not a right angle quadrangle such as a square or a rectangle.

Similarly, the average position 29 of a region surrounded by shot position coordinates R of 2×2 in length and width is calculated in order all over the writing region of the target object 101. Thereby, for almost the whole of the writing region of the target object 101, each shot region 27 (the second region) which surrounds each shot position coordinate R can be defined. Since the average position 29 is used as the point configuring the shot region 27, a plurality of shot regions 27 (the second regions) defined as described above are connected each other without any space. In other words, the total of a plurality of shot regions 27 and a partial region, which surrounds a plurality of shot regions 27 and does not overlap with a plurality of shot region 27 in the writing region of the target object 101, coincides with the writing region of the target object 101. In addition, it is impossible for a shot position at the outer periphery of the writing region of the target object 101 to define the shot region 27 because it cannot be surrounded by four shot positions, but however, by virtually defining a shot position at the outside of the writing region, a shot region 27 for the outer periphery shot position may also be defined with respect to the partial region surrounding the whole of a plurality of shot regions 27.

The shot region mesh generation unit 16 generates a shot region mesh in which the writing region of the target object 101 is divided into a plurality of shot regions 27 by using the coordinate P of each average position 29. Then, shot region mesh data is stored in the storage device 146.

FIG. 12 is a schematic diagram showing an example of the shot region mesh data according to Embodiment 1. As shown in FIG. 12, in the shot region mesh data, a coordinate P(x, y) of each average position 29 in which a distortion amount is included is defined as a map value, for example.

In the area density calculation step (S108), first, the area density calculation unit 18 reads writing data from the storage device 140, and calculates, for each of a plurality of shot regions 27, an area S of a figure pattern to be written overlapped with the shot region 27 concerned. Then, the area density calculation unit 18 calculates, for each shot region 27, an area density by dividing the area S of a figure pattern to be written overlapped with the shot region 27 concerned by a value ($AU^2$) obtained by multiplying the control grid intervals (AUs) in length and width each other.

Figure 13:
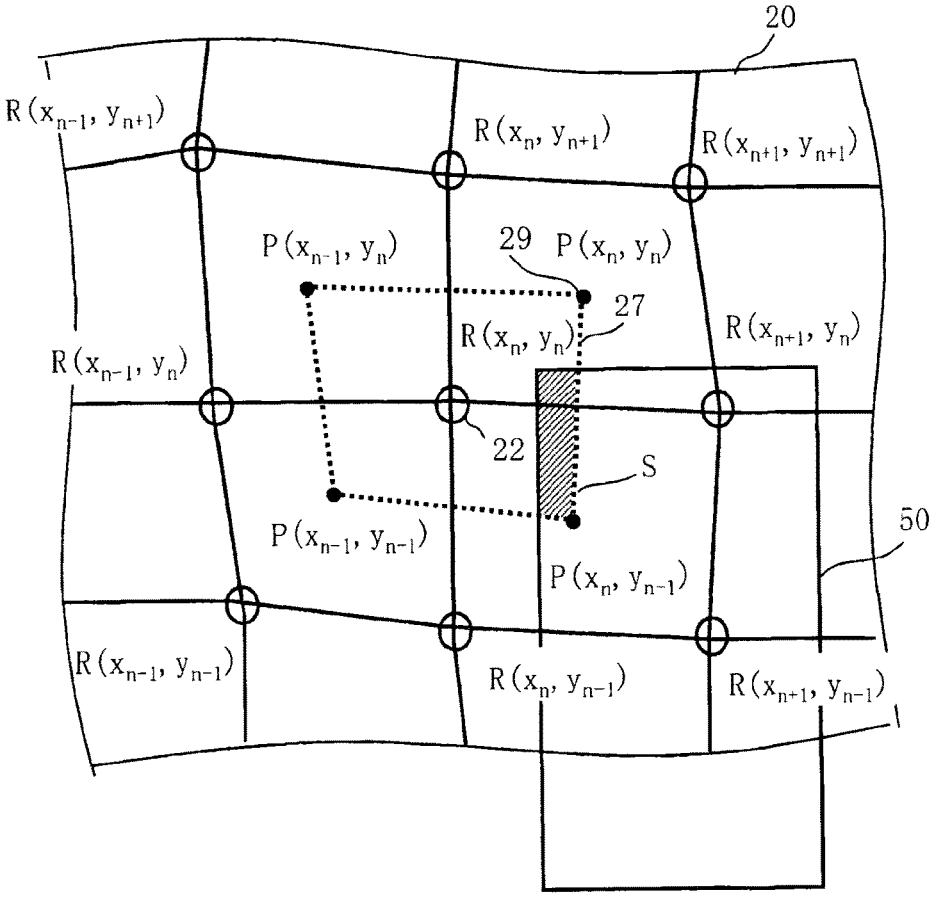
FIG. 13 is a schematic diagram showing an example of overlapping between a shot region and a figure pattern according to Embodiment 1.

FIG. 13 is a schematic diagram showing an example of overlapping between a shot region and a figure pattern according to Embodiment 1. FIG. 13 shows the case where a part of a figure pattern 50 is overlapped with the shot region 27 surrounding the shot position coordinate $R(x_n, y_n)$ which is surrounded by the average positions 29 (second condition positions of the first condition positions) of 2×2 in length and width designated by the coordinate $P(x_n, y_n)$, the coordinate $P(x_{n-1}, y_n)$, the coordinate $P(x_{n-1}, y_{n-1})$, and the coordinate $P(x_n, y_{n-1})$. The area density calculation unit 18 calculates an area density of the shot region 27 concerned by obtaining an area S of the overlapping portion and dividing the area S by $AU^2$. The area density calculation unit 18 similarly calculates area densities of the other shot regions 27. The data obtained by the above procedure is stored as an area density map in the storage device 148.

FIGS. 14A and 14B show examples of the area density map according to Embodiment 1. Each mesh indicates the shot region 27. Temporarily, an area density map 54 in the case of a shot interval of all the beams accurately coincides with AU is shown in FIG. 14B. In the example of FIG. 14B, when the mesh region (shot region) is completely covered with the figure pattern 50, the area density becomes 100%. As to the mesh regions (shot regions) including the figure ends, their area densities are 8%, 20%, 20%, 20%, 20%, 12%, 60%, 60%, 48%, 80%, 80%, 80%, 80%, 32%, 40%, and 40% from the lower left end in a clockwise rotation.

However, actually, due to the distortion described above, all of the shot intervals of beams do not accurately coincide with AU. The shot interval may become narrower than AU or wider than AU. On the other hand, according to the method of calculating an area density ρ of Embodiment 1, the area S of the overlapping portion described above is not divided by the area of the shot region 27 concerned, but divided by $AU^2$ which is intentionally set as the reference area. That is, the area density is obtained by the equation of $\rho=S/AU^2$. Here, although it is acceptable to arbitrarily set the reference area, when divided by $AU^2$ as described above, namely, when the reference area is set to be $AU^2$ and the area ratio is set based on this reference area, even if the set value of AU is changed, the area density of the portion covered with the figure becomes 100% in the case of an ideal shot interval. Thus, it is easy to understand and convenient to process.

By performing the processing described above, the area density of the mesh region (shot region) which is completely covered with the figure pattern 50 can be greater or less than 100%. Thereby, the conventionally known proximity effect correction that is achieved by correcting a dose becomes applicable, for example. In the proximity effect correction, the dose is increased or decreased to correct the influence of a reflective scattered electron generated when writing a pattern in the vicinity, and thus, pattern precision can be obtained. As described above, by performing the processing that defines a shot region (the second region) and divides the area S of the overlapping portion between this shot region and a figure pattern by a reference area, even when the shot interval becomes narrower or wider than AU, there is an effect that the amount of reflective scattered electrons generated at the shot interval is the same as that in the case where the shot interval accurately coincides with AU. Thereby, the conventional method of dose correction can be used as it is.

FIG. 14A shows an example of an area density map 52 according to Embodiment 1. In the case of FIG. 14A, the area density of the mesh region (shot region) completely covered with the figure pattern 50 is not 100% but 93% to 96%. Moreover, as to the mesh regions (shot regions) including the figure ends, their area densities are 9%, 17%, 19%, 18%, 19%, 8%, 55%, 57%, 44%, 77%, 74%, 76%, 75%, 26%, 38%, and 36% from the lower left end in a clockwise rotation. Then, here, as described above, the area density may be greater than 100%. In the case of exceeding 100%, since the dose of an actual beam irradiation may exceed the design maximum value, it is preferable to set the shot interval under the control to be less than or equal to AU if requested that the maximum value should not exceed 100%. Therefore, even when an actual beam shot deviates due to distortion and the like, precision degradation that occurs when the shot interval is greater than AU can be avoided. FIG. 14A shows the case of suppressing to be 100% or less.

In the irradiation time calculation step (S110), the irradiation time calculation unit 21 calculates an irradiation time t of a beam, whose shot position is within each shot region 27, according to the area density of each shot region 27. The irradiation time t can be calculated by multiplying a value, which is obtained by dividing a dose D by a beam current I, by an area density ρ of the shot region 27 concerned. That is, the irradiation time is obtained by the equation of $t=\rho\cdot D\cdot Sb/I$, where Sb is the area of a beam. This equation gives an irradiation dose D of a region irradiated with a single beam.

The beam size may be AU×AU or 2AU×2AU, for example, and it can be set arbitrarily. In the multi-beam system, when the beam size is 2AU×2AU, for example, a shot overlaps with an adjacent shot on the writing surface. In such a case, it is considered that the synthesized dose is equivalent to a dose of a region of AU×AU irradiated with the beam of beam current I, even if the size is 2AU×2AU. That is, the irradiation time does not depend upon the beam size, and can be calculated by $t=\rho\cdot D\cdot AU^2/I$. Although the beam current I changes depending on the beam size Sb, the beam size is usually defined to be fixed, and writing is controlled by measuring the beam current. Therefore, it is practical to treat the term of $AU^2$ to be included in a conversion coefficient k which is practically set according to the writing conditions (beam size, AU value, etc.). That is, it is practical to define $t=k'\cdot\rho\cdot D\cdot AU^2/I=k\cdot\rho\cdot D/I$. Here, although $k=k'\cdot AU^2$, k' is usually a coefficient of 1, and is practically set as a correction coefficient to be used when needed under other writing conditions.

As to the dose D, it can be calculated by $D=D_0\cdot Dp\cdot\alpha\cdot\beta$ where a dose correction coefficient Dp for correcting dimension variation, such as a proximity effect, a reference dose $D_0$, a current correction coefficient α for each beam, and a time dependent correction coefficient β are used. It is only necessary to previously calculate the dose correction parameters, such as the dose correction coefficient Dp, the reference dose $D_0$, the current correction coefficient α for each beam, and the time dependent correction coefficient β. Alternatively, the writing data processing unit 23 may input writing data in order to calculate a dose correction coefficient Dp. Therefore, it is sufficient for the irradiation time calculation unit 21 to just calculate $t=k'\cdot\rho D_0\cdot Dp\cdot\alpha\cdot\beta\cdot AU^2/I=k\cdot\rho\cdot D_0\cdot Dp\cdot\alpha\cdot\beta/I$.

In addition, in the case where the sensitivity of resist changes depending upon time after writing or where a beam current changes in time, the time dependent correction coefficient β is set, and the time dependent correction coefficient β may be used for correction. Moreover, since the area density is $\rho=S/AU^2$, the irradiation time can also be calculated by $t=k'\cdot S\cdot D_0\cdot Dp\cdot\alpha\cdot\beta/I$. This equation indicates that the calculation can be also achieved by not using the area density ρ but using the area S as it is, and which is to be used may be determined depending on the design. There may be a case where superimposed writing is performed by multiplex exposure depending on a writing method, and in such a case, a dose is added for the superimposing. In any event, it is only necessary to perform calculation based on the equation described above to be in accordance with the writing method.

Here, the irradiation time calculation unit 21 performs calculation including the dose D, but it is not limited thereto. It is also preferable to perform calculation as follows: first, a dose calculation unit (not shown) calculates a dose D of a beam whose shot position is within each shot region 27, and after calculating the dose D, the irradiation time calculation unit 21 calculates, using the dose D, an irradiation time t depending on the area density of each shot region 27.

FIG. 15 shows an example of an irradiation time map according to Embodiment 1. Each mesh in an irradiation time map 56 indicates the shot region 27. FIG. 15 shows values each obtained by multiplying each map value in the area density map 52 shown in FIG. 14A by a reference irradiation time $T_0$. In such a case, the reference irradiation time $T_0$ is defined by the equation of $T_0=D_0 \cdot AU^2/I=k \cdot D_0/I$, which is a control value inside the control circuit for giving a reference dose. To multiply the reference irradiation time $T_0$ indicates to convert the irradiation time of each shot into a control value inside the control circuit. FIG. 15 shows the case of $T_0=500$ and $Dp \cdot \alpha \cdot \beta=1$ as a simple example.

In the Z correction step (S111), by the electrostatic lens 211, it is set such that correction of the focal position of each beam, where the focal position changes by the height position shown in the height position distribution, advances with the advance of writing processing. In other words, the electrostatic lens 211 corrects the focal position of each beam due to change of the height position shown in the height position distribution.

In the writing step (S112), the writing processing control unit 25 performs controlling such that writing processing advances at shot intervals each being less than or equal to AU as described above. Then, the writing unit 150 controlled by the writing processing control unit writes a pattern on the target object by irradiating each beam of the irradiation time t for each shot region 27 obtained by the method described above. Specifically, a shot beam is variably controlled to be corresponding to an irradiation time calculated by the irradiation time calculation unit 21. The irradiation time calculation unit 21 outputs the irradiation time of each shot to the deflection control circuit 130. Then, the deflection control circuit 130, when performing a corresponding shot, outputs a digital signal for controlling the blanker to turn the beam on during the irradiation time t to the DAC amplifier 134. Then, the DAC amplifier 134 converts the digital signal into an analog signal and amplifies it to be applied as a deflection voltage to a corresponding blanker of the blanking plate 204. As described above, the dose is variably controlled depending upon a shot position. On the other hand, the writing processing control unit 25 outputs deflection position data to the deflection control circuit 132 so that each beam may be deflected to a desired shot position. The deflection control circuit 132 calculates a deflection amount, outputs a digital signal for control to the DAC amplifier 136. Then, the DAC amplifier 136 converts the digital signal into an analog signal and amplifies it to be applied as a deflection voltage to the deflector 208. Thereby, the multiple beams 20 of one shot are collectively deflected.

As described above, according to Embodiment 1, by defining a shot position based on not a design position but a shot position including an amount of distortion, and defining the shot region 27 based on such shot position R, it becomes possible to radiate a shot beam having the dose D for correcting a positional deviation due to distortion. As a result, pattern shape change or size change due to deviation of the irradiation position of multiple beams caused by distortion of the optical system and the like can be suppressed. Consequently, patterns can be highly precisely written with multiple beams.

In the examples described above, although the shot region 27 is defined by the quadrangle composed by connecting the four average positions 29, it is not limited thereto.

Figure 16:
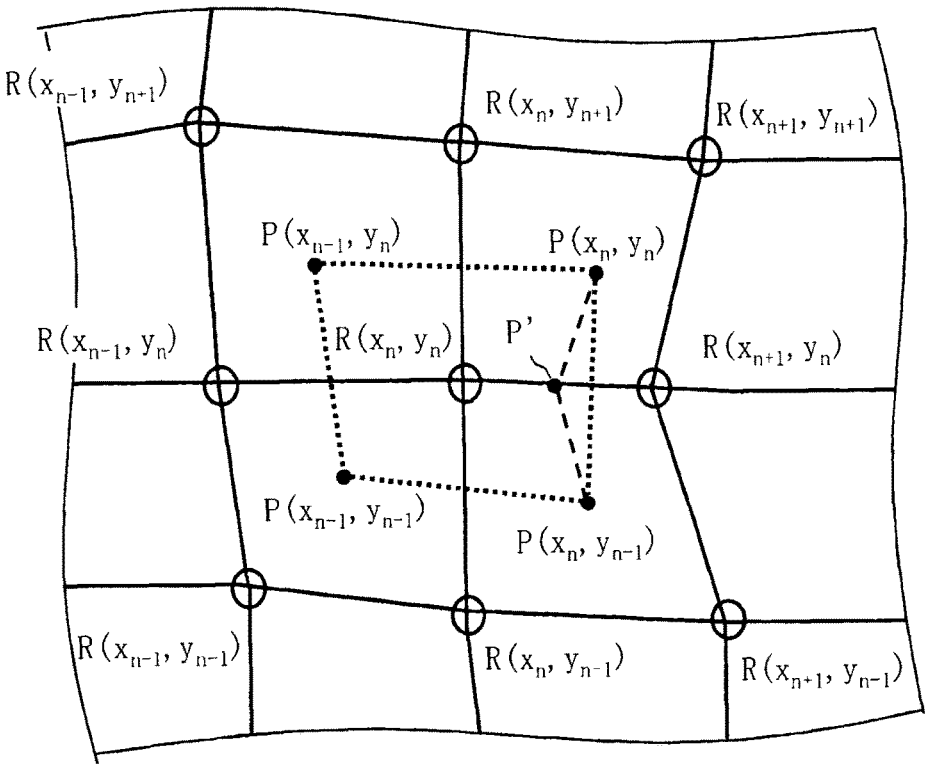
FIG. 16 is a schematic diagram showing another example of the shot region mesh according to Embodiment 1.

FIG. 16 is a schematic diagram showing another example of the shot region mesh according to Embodiment 1. If the shot position 22 designated by the coordinate $R(x_{n+1}, y_n)$ shifts largely by distortion, it is acceptable to calculate a further average position P' at the average position (middle position) between the coordinate $R(x_n, y_n)$ and the coordinate $R(x_{n+1}, y_n)$. For example, it is preferable to determine a set value concerning a deviation amount of the shot position 22 in advance, and, when the amount of deviation becomes greater than or equal to this set value (for example, 10% of AU), to calculate a further average position P'. In the example of FIG. 16, the shot region 27 (the second region) surrounding the shot position coordinate $R(x_n, y_n)$ is defined, where the shot position coordinate $R(x_n, y_n)$ is surrounded by average positions 29 each of which is designated by the coordinate $P(x_n, y_n)$, the coordinate $P\ y_n)$, the coordinate $P(x_{n-1}, y_{n-1})$ and the coordinate $P(x_n, y_{n-1})$, and the further average position P'. Therefore, even when the shot position largely deviates, writing precision can be increased.

Although the shot region 27 is defined by one quadrangle composed by connecting the four average positions 29 in the examples described above, it is not limited thereto.

Figure 17:
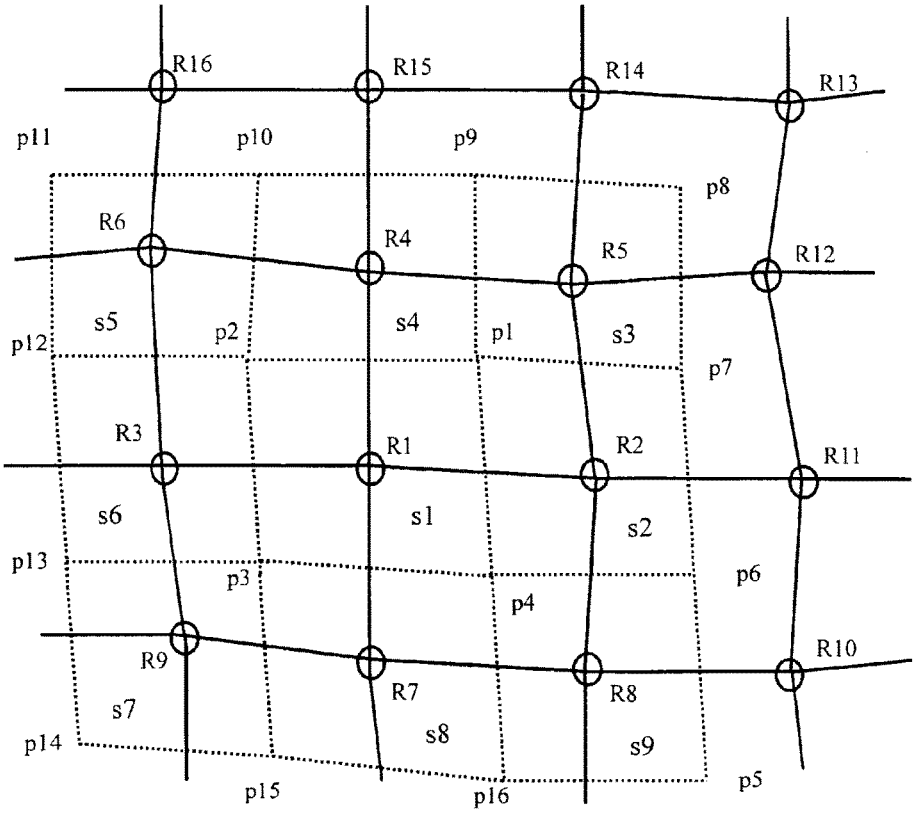
FIG. 17 is a schematic diagram showing another example of the shot region mesh according to Embodiment 1.

FIG. 17 is a schematic diagram showing another example of the shot region mesh according to Embodiment 1. In FIG. 17, the area density ρ for calculating the dose D of the shot position 22 designated by the coordinate R1 may be defined not by one quadrangle s1 composed by connecting the four average positions 29 designated by p1 to p4 and surrounded by the four average positions 29 designated by p1 to p4, but by one shot region composed of quadrangles s1 to s9, where the surrounding quadrangles s2 to s9 are added to s1 to configure one shot region. In such a case, although a shot region for a shot position 22 is overlapped with another shot region for another shot position 22, when calculating an area density ρ for obtaining a dose D of the shot position 22 designated by the coordinate R1, it is only necessary to obtain a value by dividing the area S of the overlapping portion between the quadrangles s1 to s9 and the figure pattern by the number of quadrangles (in this case, nine). The area density ρ for other shot position 22 can also be calculated in the same way. Thus, from the viewpoint of the whole writing region, the sum of the area S defined using one quadrangle s1 can be the same as the sum of the area S defined using a plurality of quadrangles s1 to s9. Alternatively, it is also preferable to perform calculation by weighting in which the area S of the center quadrangle s1 including the shot position 22 designated by the coordinate R1 is divided by two (1/2) and the area S of each of the surrounding quadrangles s2 to s9 is divided by sixteen (1/16), as an example.

Moreover, the coordinate point which sections the shot region based on the average position of the four shot positions is calculated in the Embodiments described above, but however, it is also acceptable to define a coordinate point based on an average position or a gravity center of four or more shot positions. With reference to FIG. 17, according to the Embodiment described above, the coordinate point p1 which sections the shot region based on the average position of the four shot positions (R1, R2, R4, R5) is calculated. Furthermore, it is also preferable to define the coordinate p1 based on an average position obtained by increasing the shot positions, such as obtaining an average position of the sixteen shot positions (R1, R2, R3, R4, R5, R6, R7, R8, R9, R10, R11, R12, R13, R14, R15, R16) in the surrounding region, or obtaining an average position of the twelve shot positions (R1, R2, R3, R4, R5, R6, R7, R8, R11, R12, R14, R15) in the surrounding region, which are acquired by excluding the four shot positions at the corners from the sixteen shot positions described above. In the case of the sixteen shot positions, each of the coordinate values of X and Y of the coordinate point p1 can be calculated by adding sixteen X coordinate values or sixteen Y coordinate values, and dividing the added value by sixteen. In the case of the twelve shot positions, each of the X and Y coordinate values of the coordinate point p1 can be calculated by adding twelve X coordinate values or twelve Y coordinate values, and dividing the added value by twelve.

Moreover, it is also preferable to define the coordinate point p1 by calculating the average or the center of gravity which is obtained by weighting each coordinate point. For example, depending on the distance from the target position, the average or the center of gravity is calculated by weighting the shot positions (R1, R2, R4, R5) close to the target position by 2, and weighting the other shot positions (R3, R6, R7, R8, R9, R10, R11, R12, R13, R14, R15, R16) by 1. Then, in this case, each of the X and Y coordinate values of the coordinate point p1 is calculated by the processing in which respective X and Y coordinate values of the shot positions (R1, R2, R4, R5) are multiplied by 2 and added, and respective X and Y coordinate values of the other shot positions are multiplied by 1 and added, and the added value is divided by 20.

Thus, by increasing the number of shot positions being calculation targets, a coordinate point can be defined based on a result reflecting deviation of the surrounding shot positions in a larger range, and even when there is locally a shot position which is largely deviated, since a correction calculation result equalized among shots can be obtained, the precision can be improved.

Generally, when the number of calculation targets is increased, calculation processing takes much time, but however, concrete calculation to be performed may be selected by design depending on precision requirement.

Embodiments have been explained referring to concrete examples described above. However, the present invention is not limited to these specific examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing method comprising:

calculating first shot positions of multiple beams, each of the first shot positions including a distortion amount of an irradiating corresponding beam, in a case of irradiating each beam of multiple beams of a charged particle beam on a target object, based on control grid intervals having been set in length and width in advance;

calculating first condition positions based on a pre-set condition, each of the first condition positions being arranged in a corresponding first region of a plurality of first regions respectively surrounded by closest second shot positions of 2×2 in length and width of the first shot positions, using the first shot positions including the distortion amount of the corresponding beam;

calculating, for each of a plurality of second regions respectively surrounded by a plurality of closest second condition positions of the first condition positions, an area density of a figure pattern to be written in overlapping with a second region concerned in the plurality of second regions, by using the first condition positions;

calculating an irradiation amount or an irradiation time of each beam whose corresponding first shot position of the first shot positions is in a corresponding second region of the plurality of second regions, based on an area density of a second region concerned; and writing a pattern on a target object by irradiating a beam of the irradiation amount or the irradiation time calculated.

2. The method according to claim 1, wherein the plurality of second regions are connected without any space.

3. The method according to claim 1, wherein the first condition position is an average position or a gravity center position of the closest second shot positions surrounding the corresponding first region of the plurality of first regions.

4. The method according to claim 1 further comprising:

measuring a height position distribution of a writing region of the target object; and correcting a focal position of each beam, where the focal position changes by a height position in the height position distribution, wherein distortion of the each beam includes a distortion resulting from the correcting the focal position.

5. The method according to claim 1, wherein each of the plurality of second regions is surrounded by closest second condition positions of 2×2 in length and width as the plurality of closest second condition positions, and in a case there is an additional condition position which is to be added based on a pre-set condition, the each of the plurality of second regions is surrounded by the closest second condition positions of 2×2 in length and width and the additional condition position.

6. A multi charged particle beam writing apparatus comprising:

a stage configured to mount a target object thereon and to be movable;

an [emission unit] *emitter* configured to emit a charged particle beam;

an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;

a plurality of blankers configured to respectively perform blanking deflection of a corresponding beam in the multiple beams having passed through the plurality of openings of the aperture member;

a blanking aperture member configured to block each beam that has been deflected to be in an off state by the plurality of blankers;

a deflector configured to collectively deflect each beam having passed through the blanking aperture member to each irradiation position on the target object for the each beam having passed through the blanking aperture member;

a shot position calculation unit configured *by a circuit or a computer,* to calculate first shot positions of multiple beams, each of the first shot positions including a distortion amount of an irradiating corresponding beam, in a case of irradiating each beam of multiple beams of a charged particle beam on a target object, based on control grid intervals having been set in length and width in advance;

a condition position calculation unit configured *by a circuit or the computer,* to calculate first condition positions based on a pre-set condition, each of the first condition positions being arranged in a corresponding first region of a plurality of first regions respectively surrounded by closest second shot positions of 2×2 in length and width of the first shot positions, using the first shot positions including the distortion amount of the corresponding beam;

an area density calculation unit configured *by a circuit or the computer,* to calculate, for each of a plurality of second regions respectively surrounded by a plurality of closest second condition positions of the first condition positions, an area density of a figure pattern to be written in overlapping with a second region concerned in the plurality of second regions, by using the first condition positions;

an irradiation time calculation unit configured *by a circuit or the computer,* to calculate an irradiation time of each beam whose corresponding first shot position is in a corresponding second region of the plurality of second regions, based on an area density of a second region concerned; and a deflection control unit configured *by a circuit or the computer,* to perform blanking deflection control of the plurality of blankers so that each beam of the irradiation time calculated irradiates the target object.

7. The apparatus according to claim 6, wherein the plurality of second regions are connected without any space.

8. The apparatus according to claim 6, wherein the first condition position is an average position or a gravity center position of the closest second shot positions surrounding a first region of the plurality of first regions.

9. The apparatus according to claim 6 further comprising:

a sensor configured to measure a height position distribution of a writing region of the target object; and an electrostatic lens configured to correct a focal position of each beam, where the focal position changes by a height position in the height position distribution, wherein distortion of the each beam includes a distortion resulting from correcting the focal position.

10. The apparatus according to claim 6, wherein each of the plurality of second regions is surrounded by closest second condition positions of 2×2 in length and width as the plurality of closest second condition positions, and in a case there is an additional condition position which is to be added based on a pre-set condition, the each of the plurality of second regions is surrounded by the closest second condition positions of 2×2 in length and width and the additional condition position.

*11. The method according to claim 1,*

*wherein when calculating said area density of the figure pattern for the each of the plurality of second regions, said area density is calculated using a plurality of second regions surrounding the second region concerned.*

*12. The method according to claim 11,*

*wherein area densities in the second region concerned and the plurality of second regions surrounding the second region concerned are respectively calculated by weighting, for the each of the plurality of second regions, and*

*said area density used for calculating the irradiation amount or the irradiation time, becomes a statistical value of area densities weighted in the second region concerned and the plurality of second regions surrounding the second region concerned.*

*13. The method according to claim 12,*

*wherein a weighting value for the second region concerned is different from weighting values for the plurality of second regions surrounding the second region concerned.*

*14. The method according to claim 12,*

*wherein one of a sum and an average of area densities weighted in the second region concerned and the plurality of second regions surrounding the second region concerned is used as the statistical value.*

*15. The method according to claim 1,*

*wherein the irradiation amount or the irradiation time is corrected by using a dose correction parameter.*

*16. The apparatus according to claim 6,*

*wherein the area density calculation unit calculates said area density using a plurality of second regions surrounding the second region concerned for each of a plurality of second regions.*

*17. The apparatus according to claim 16,*

*wherein the area density calculation unit calculates by weighting, area densities in the second region concerned and the plurality of second regions surrounding the second region concerned respectively, and*

*the area density calculation unit calculates a statistical value of area densities weighted in the second region concerned and the plurality of second regions surrounding the second region concerned, as said area density used for calculating the irradiation amount or the irradiation time.*

*18. The apparatus according to claim 6 further comprising:*

*a sensor configured to measure a height position distribution of a writing region of the target object; and*

*a lens configured to correct a focal position of each beam, where the focal position changes by a height position in the height position distribution,*

*wherein distortion of the each beam includes a distortion resulting from correcting the focal position.*

* * * * *